(12) United States Patent
Lewandowski et al.

(10) Patent No.: US 6,543,016 B1
(45) Date of Patent: Apr. 1, 2003

(54) TESTING CONTENT-ADDRESSABLE MEMORIES

(75) Inventors: James L. Lewandowski, Plainsboro, NJ (US); Frank P. Higgins, Trenton, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/433,759

(22) Filed: Nov. 4, 1999

(51) Int. Cl.[7] .......................... G11C 29/00; G06F 11/00
(52) U.S. Cl. ...................... 714/718; 714/703; 711/108
(58) Field of Search .................. 714/733, 703, 714/713, 734, 738, 718, 719, 720, 819, 37, 42; 711/100, 108; 365/200, 201

(56) References Cited

U.S. PATENT DOCUMENTS

| | | | |
|---|---|---|---|
| 4,726,021 A | * 2/1988 | Horiguchi et al. | 714/773 |
| 5,062,109 A | * 10/1991 | Ohshima et al. | 714/719 |
| 5,107,501 A | 4/1992 | Zorian | 714/720 |
| 5,363,382 A | * 11/1994 | Tsukakoshi | 714/719 |
| 5,848,074 A | 12/1998 | Maeno | 714/720 |

* cited by examiner

*Primary Examiner*—Christine T. Tu
(74) *Attorney, Agent, or Firm*—Duane Morris LLP

(57) ABSTRACT

A content-addressable memory (CAM) has a memory array for storing data, the memory array having E entries each having N data bits and a valid bit. The functionality of the CAM is tested by testing the memory array for read/write functionality. The functionality of a matching function, a priority encoding function, a match flag function, and a multiple match flag function of the CAM is tested. The functionality of an invalidate data function and a valid data restricted search function is also tested.

13 Claims, 14 Drawing Sheets

100

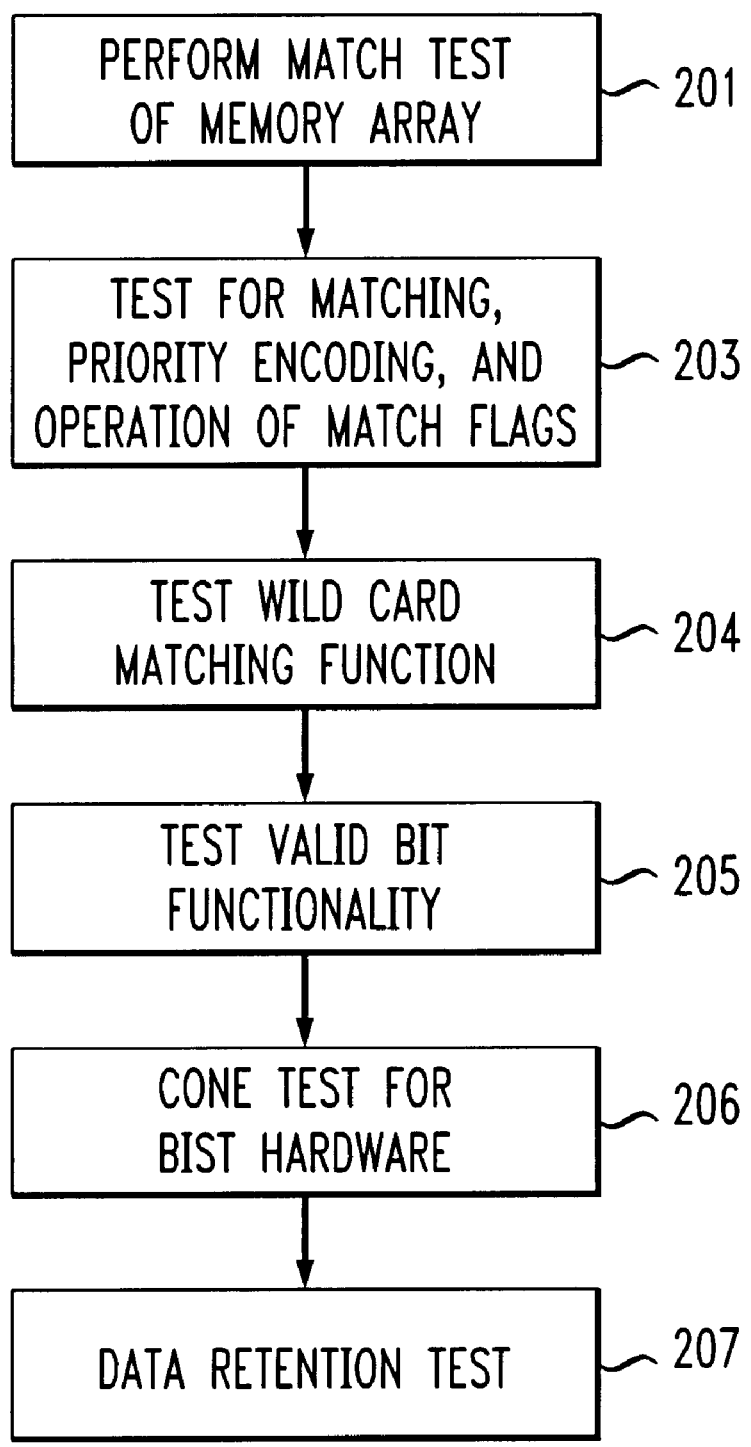

FIG. 3A

| LINE NO. | STATE | OPERATION | CAM MEMORY 4 WORDS x 3 BITS b2 b1 b0 vd Adr. | ADDRESS POINTER | VMS BIT | DATA WRITE PATTERN D2 D1 D0 VD | WILD CARD PATTERN wc2 wc1 wc0 vwc | EXPECTED OUTPUTS AM MF MMN |
|---|---|---|---|---|---|---|---|---|
| 1 | | INITIALIZED MEMORY STATE -> | 1 1 1 1 "11" | | | | | |
| 2 | s0 | SEARCH PATTERN(MS) = "111" | 1 1 1 1 "10" | | | | | |
| 3 | | BIT WRITE PATTERN(D) = "1111" | 1 1 1 1 "01" | | | | | |
| 4 | | | 1 1 1 1 "00" | | | | | |
| 5 | s1 | INITIALIZE ADDRESS | | "00" | | | | |
| 6 | s2 | INITIALIZE DATA | 1 1 1 1 "11" | | | | | |
| 7 | | MATCH WITH NO WILD CARD-FIRST | 1 1 1 1 "10" | | | | 0 0 0 0 | |
| 8 | | | 1 1 1 1 "01" | | | | | |
| 9 | | | 1 1 1 1 "00" | | | | | "00" 1 0 |
| 10 | | | | | | | | |
| 11 | s3 | WRITE BIT 2 | 1 1 1 1 "11" | "00" | 1 | 0 1 1 1 | | |
| 12 | s4 | MATCH WITH NO WILD CARD | 1 1 1 1 "10" | | | | 0 0 0 0 | |
| 13 | | | 1 1 1 1 "01" | | | | | |
| 14 | | | 0 1 1 1 "00" | | | | | |
| 15 | | | | | | | | "01" 1 0 |
| 16 | s3 | WRITE BIT 1 | 1 1 1 1 "11" | "00" | 1 | 1 0 1 1 | | |
| 17 | s4 | MATCH WITH NO WILD CARD | 1 1 1 1 "10" | "01" | | | 0 0 0 0 | |
| 18 | | | 1 1 1 1 "01" | | | | | |
| 19 | | | 1 0 1 1 "00" | | | | | |
| 20 | | | | | | | | "01" 1 0 |

FIG. 3A cont. (a)

| Row | State | Operation | Data grid | Labels | Bits | | | | | Code | |
|---|---|---|---|---|---|---|---|---|---|---|---|
| 21-25 | s3 / s4 | WRITE BIT 0 / MATCH WITH NO WILD CARD | 1 1 1 1<br>1 1 1 1<br>1 1 1 1<br>1 1 1 0 | "11"<br>"10"<br>"01"<br>"00" | "00"<br>"10" | 1 | 1 1 0 1 | 0 0 0 0 | "01" | 1 0 |
| 26-30 | s3 / s4 | WRITE VALID BIT / MATCH WITH NO WILD CARD | 1 1 1 1<br>1 1 1 1<br>1 1 1 1<br>1 1 1 0 | "11"<br>"10"<br>"01"<br>"00" | "00"<br>"01" | 1 | 1 1 1 0 | 0 0 0 0 | "01" | 1 0 |
| 31-35 | s5 | WRITE FULL WORD WITH 0 NEXT ADDRESS | 1 1 1 1<br>1 1 1 1<br>1 1 1 0<br>0 0 0 0 | "11"<br>"10"<br>"01"<br>"00" | "00"<br>"01" | | 0 0 0 0 | | | |
| 37-41 | s3 / s4 | WRITE BIT 2 / MATCH WITH NO WILD CARD | 1 1 1 1<br>1 1 1 0<br>1 0 1 0<br>0 0 0 0 | "11"<br>"10"<br>"01"<br>"00" | "01"<br>"01" | 1 | 0 1 1 1 | 0 0 0 0 | "10" | 1 0 |

FIG. 3A cont. (b)

| | | | | | | | | |
|---|---|---|---|---|---|---|---|---|
| 42 | s3 | WRITE BIT 1 | | | | | | |
| 43 | s4 | MATCH WITH NO WILD CARD | 1 1 1 1 | "11" | | 1 | 0 | |
| 44 | | | 1 1 1 1 | "10" | 1 | 0 | 0 | |
| 45 | | | 1 1 1 1 | "01" | | 1 | 0 | "10" 1 |
| 46 | | | 0 0 0 0 | "00" | | 1 | 0 | 0 |
| 47 | s3 | WRITE BIT 0 | | | | | | |
| 48 | s4 | MATCH WITH NO WILD CARD | 1 1 1 1 | "11" | | 1 | 0 | |
| 49 | | | 1 1 1 1 | "10" | 1 | 1 | 0 | |
| 50 | | | 1 1 1 1 | "01" | | 0 | 0 | "10" 1 |
| 51 | | | 0 0 0 0 | "00" | | 1 | 0 | 0 |
| 52 | s3 | WRITE VALID BIT | | | | | | |
| 53 | s4 | MATCH WITH NO WILD CARD | 1 1 1 1 | "11" | | 1 | 0 | |
| 54 | | | 1 1 1 1 | "10" | 1 | 1 | 0 | |
| 55 | | | 1 1 0 0 | "01" | | 1 | 0 | "10" 1 |
| 56 | | | 0 0 0 0 | "00" | | 0 | 0 | 0 |
| 57 | s5 | WRITE FULL WORD WITH 0 | | | | | | |
| 58 | | NEXT ADDRESS | 1 1 1 1 | "11" | | 0 | 0 | |
| 59 | | | 1 1 1 1 | "10" | | 0 | 0 | |
| 60 | | | 0 0 0 0 | "01" | | 0 | 0 | |
| 61 | | | 0 0 0 0 | "00" | | 0 | 0 | |

FIG. 3B

| LINE NO. | STATE | OPERATION | CAM MEMORY 4 WORDS x 3 BITS b2 b1 b0 vd Adr. | ADDRESS POINTER | VMS BIT | DATA WRITE PATTERN D2 D1 D0 VD | WILD CARD PATTERN wc2 wc1 wc0 vwc | EXPECTED OUTPUTS AM MF MMN |
|---|---|---|---|---|---|---|---|---|
| 62 | s3 | WRITE BIT 2 |  | "10" | 1 | 0 1 1 1 | 0 0 0 0 |  |
| 63 | s4 | MATCH WITH NO WILD CARD |  | "10" |  |  |  | "11" 1 1 |
| 64 |  |  | 1 1 1 1 "11" |  |  |  |  |  |
| 65 |  |  | 0 1 1 1 "10" |  |  |  |  |  |
| 66 |  |  | 0 0 0 0 "01" |  |  |  |  |  |
| 67 |  |  | 0 0 0 0 "00" |  |  |  |  |  |
| 68 | s3 | WRITE BIT 1 |  | "10" | 1 | 1 0 1 1 | 0 0 0 0 |  |
| 69 | s4 | MATCH WITH NO WILD CARD |  | "11" |  |  |  | "11" 1 1 |
| 70 |  |  | 1 1 1 1 "11" |  |  |  |  |  |
| 71 |  |  | 1 0 1 1 "10" |  |  |  |  |  |
| 72 |  |  | 0 0 0 0 "01" |  |  |  |  |  |
| 73 |  |  | 0 0 0 0 "00" |  |  |  |  |  |
| 74 | s3 | WRITE BIT 0 |  | "10" | 1 | 1 1 0 1 | 0 0 0 0 |  |
| 75 | s4 | MATCH WITH NO WILD CARD |  | "11" |  |  |  | "11" 1 1 |
| 76 |  |  | 1 1 1 1 "11" |  |  |  |  |  |
| 77 |  |  | 1 1 0 1 "10" |  |  |  |  |  |
|  |  |  | 0 0 0 0 "01" |  |  |  |  |  |
|  |  |  | 0 0 0 0 "00" |  |  |  |  |  |

FIG. 3B cont. (a)

| Row | | Description | | | | | | | | |
|---|---|---|---|---|---|---|---|---|---|---|
| 78-82 | s3/s4 | WRITE VALID BIT / MATCH WITH NO WILD CARD | 1 1 1 1 / 1 1 1 0 / 0 0 0 0 / 0 0 0 0 | "11"/"10"/"01"/"00" | "10"/"11" | 1 | 1 1 1 0 | 0 0 0 1 | "11" 1 |
| 83-87 | s5 | WRITE FULL WORD WITH 0 NEXT ADDRESS | 1 1 1 1 / 0 0 0 0 / 0 0 0 0 / 0 0 0 0 | "11"/"10"/"01"/"00" | "10" | | 0 0 0 0 | | |
| 88-92 | s3/s4 | WRITE BIT 2 / MATCH WITH NO WILD CARD | 0 1 1 1 / 0 0 0 0 / 0 0 0 0 / 0 0 0 0 | "11"/"10"/"01"/"00" | "11"/"11" | 1 | 0 1 1 1 | 0 0 0 1 | all high 0 1 |
| 93-98 | s3/s4 | WRITE BIT 1 / MATCH WITH NO WILD CARD | 1 0 1 1 / 0 0 0 0 / 0 0 0 0 / 0 0 0 0 | "11"/"10"/"01"/"00" | "11"/"00" | 1 | 1 0 1 1 | 0 0 0 1 | all high 0 1 |

| LINE NO. | STATE | OPERATION | CAM MEMORY 4 WORDS x 3 BITS b2 b1 b0 vd Adr. | ADDRESS POINTER | VMS BIT | DATA WRITE PATTERN D2 D1 D0 VD | WILD CARD PATTERN wc2 wc1 wc0 vwc | EXPECTED OUTPUTS AM MF MMN |
|---|---|---|---|---|---|---|---|---|
| 125 | s7 | INITIALIZE FOR WILD CARD TEST-ADDRESS, DATA, SNDPASS = 0 | | | | | | |
| 126 | | SEARCH PATTERN(MS)="111" | | | | | | |
| 127 | s8 | WRITE BIT 2 | | "00" | | 0 1 1 1 | | |
| 128 | s9 | MATCH WITH WILD CARD | 1 1 1 1 "11" | "00" | 1 | | 1 0 0 0 | "00" 1 0 |
| 129 | | | 1 1 1 1 "10" | | | | | |
| 130 | | | 1 1 1 1 "01" | | | | | |
| 131 | | | 0 1 1 1 "00" | | | | | |
| 132 | s8 | WRITE BIT 1 | | "00" | | 1 0 1 1 | | |
| 133 | s9 | MATCH WITH WILD CARD | 1 1 1 1 "11" | "00" | 1 | | 0 1 0 0 | "00" 1 0 |
| 134 | | | 1 1 1 1 "10" | | | | | |
| 135 | | | 1 0 1 1 "01" | | | | | |
| 136 | | | 1 1 1 1 "00" | | | | | |
| 137 | s8 | WRITE BIT 0 | | "00" | | 1 1 0 1 | | |
| 138 | s9 | MATCH WITH WILD CARD | 1 1 1 1 "11" | "00" | 1 | | 0 0 1 0 | "00" 1 0 |
| 139 | | | 1 1 1 1 "10" | | | | | |
| 140 | | | 1 1 1 1 "01" | | | | | |
| 141 | | | 1 1 0 1 "00" | | | | | |

FIG. 3C cont. (a)

| | | | | | | | | | |
|---|---|---|---|---|---|---|---|---|---|
| 142 | s8 | WRITE VALID BIT | | | | | | | |
| 143 | s9 | MATCH WITH WILD CARD | 1 1 1 1 | "11" | "00" | 1 | 1 1 1 0 | 0 0 0 1 | "00" 1 0 |
| 144 | | | 1 1 1 1 | "10" | "00" | | | | |
| 145 | | | 1 1 1 1 | "01" | | | | | |
| 146 | | | 1 1 1 0 | "00" | | | | | |
| 147 | s10 | SET UP – SNDPASS = 1 | | | "00" | | | | |
| 148 | | | 1 1 1 1 | "11" | | | 1 1 1 | | |
| 149 | s11 | WRITE FULL WORD WITH 1 | 1 1 1 1 | "10" | | | 1 1 1 | | |
| 150 | | | 1 1 1 1 | "01" | | | | | |
| 151 | | | 1 1 1 1 | "00" | | | | | |
| 152 | | | | | | | | | |
| 153 | s12 | INVALIDATE ALL DATA | 1 1 1 0 | "11" | "xx" | x | | 1 1 1 | |
| 154 | | | 1 1 1 0 | "10" | "xx" | | | 1 1 1 | |
| 155 | | | 1 1 1 0 | "01" | | | | | |
| 156 | | | 1 1 1 0 | "00" | | | | | |
| 157 | | | | | | | | | |
| 158 | s13 | SEARCH VALID DATA | 1 1 1 0 | "11" | "xx" | 1 | | 1 1 1 0 | all high 0 1 |
| 159 | | | 1 1 1 0 | "10" | "xx" | | | | |
| 160 | | | 1 1 1 0 | "01" | | | | | |
| 161 | | | 1 1 1 0 | "00" | | | | | |

FIG. 3C cont. (b)

| | | | | | | |
|---|---|---|---|---|---|---|
| 162 | | | | | | |
| 163 | s14 | SET UP | | | | |
| 164 | s15 | SEARCH ALL DATA | 1 1 1 1 0 "11" | "00" | x | |
| 165 | | | 1 1 1 1 0 "10" | | | |
| 166 | | | 1 1 1 1 0 "01" | | | |
| 167 | | | 1 1 1 1 0 "00" | | | |
| 168 | s16 | CONE TEST FOR ADDRESS EVAL. | 1 1 1 1 0 "11" | "01" | | |
| 169 | | | 1 1 1 1 0 "10" | | | |
| 170 | | | 1 1 1 1 0 "01" | | | |
| 171 | | | 1 1 1 1 0 "00" | | | |
| 172 | s16 | CONE TEST FOR ADDRESS EVAL. | 1 1 1 1 0 "11" | "10" | | |
| 173 | | | 1 1 1 1 0 "10" | | | |
| 174 | | | 1 1 1 1 0 "01" | | | |
| 175 | | | 1 1 1 1 0 "00" | | | |
| 176 | | | | | | |
| 177 | s17 | CONE TEST – EXP. MMN = 1 | 1 1 1 1 0 "11" | "00" | 1 1 1 1 | "00" 1 0 |
| 178 | | | 1 1 1 1 0 "10" | | | |
| 179 | | | 1 1 1 1 0 "01" | | | |
| 180 | | | 1 1 1 1 0 "00" | | | |
| 181 | | | | | | |

FIG. 3C cont. (c)

| | | | | | |
|---|---|---|---|---|---|
| 182 | | | | | |
| 183 | s18 | CONE TEST – EXP. MF = 0 | 1 1 1 1 | 0 0 0 0 | "11" "10" "01" "00" |
| 184 | | | | | |
| 185 | | | | | |
| 186 | | | | | |
| 187 | | | | | "00" |
| 188 | s19 | DONE – START NEXT FSM | 1 1 1 1 | 0 0 0 0 | "11" "10" "01" "00" |
| 189 | | | | | |
| 190 | | | | | |
| 191 | | | | | "00" |

400

TESTING CONTENT-ADDRESSABLE MEMORIES

BACKGROUND OF THE INVENTION

1. Field of the Invention

The present invention relates to content-addressable memories (CAMs) and, in particular, to test algorithms for testing CAMs.

2. Description of the Related Art

Computer memory cells are in wide use today. Each memory cell stores a bit of data, i.e. a logic-0 or logic-1, sometimes referred to as low or high, respectively, corresponding to the low voltage state (typically $V_{SS}$, e.g. ground=0V)) or the high voltage state (typically $V_{DD}$, e.g. 3V). New data may be written into the cell, and stored data may be read from the cell. This is typically done by "enabling" the cell by providing a control signal to a control input terminal, which allows data in the cell to be read out on a second, data terminal (or data provided on the data terminal is written in the cell in a write operation).

An array of memory cells are typically provided in a memory array architecture. In a memory cell array, each row of memory cells is typically used to provide storage of larger, multi-bit units of data such as bytes or words. The memory array provides a number of rows or words to provide multiple word storage.

Memory arrays can be implemented in various forms, including Flash EEPROM, DRAM, ROM, and SRAM. Memory arrays are increasingly used in integrated circuits (ICs) in devices such as cellular telephones, answering machines, cordless phones, and other applications. Content-addressable memories (CAMs) are also used in various applications. Memory devices such as CAM, RAM, and other memory devices may be fabricated as part of an IC within a semiconductor chip. Chips are formed in the substrate of a physical wafer, e.g. a silicon wafer. Typically, several chips are formed on each wafer. A wafer is a very thin, flat disc of a given diameter. The manufacturing process consists of operations on the surface and substrate of the wafer to create a number of chips. Once the wafer is completely processed, it is cut up into the individual chips, the size of which depends on the number of components and complexity of each chip.

Each byte of memory typically is addressable by its address. Unlike RAM, however, which searches for data at a particular address. CAMS also allow bytes to be accessed by the content of the bytes themselves, not only by their address. A CAM can provide a standard memory operation, such as read/write data from/to the memory location specified by the address inputs. A CAM can also provide a search function, whereby any content stored in the CAM can by searched directly without using address input. The standard read/write operation of a CAM is typically similar to the read/write operation of an SRAM.

CAMs are used in several applications, such as look-up tables and artificial neural networks. A CAM may be used in an electronic spelling checker, for example, where a CAM-based dictionary is searched to locate a word with a specific spelling. If there is at least one word with the same spelling as the input word, the search will be successful. As the semiconductor industry's average cost per gate continues to drop, CAMs are finding ever-wider application. Today, large CAMs (greater than 1 Kb) are also being used for memory management, database management, and data flow computing architectures.

A typical CAM includes an array of core cells and comparators, so as to perform the dual functions of storage of a bit of data and comparison of the stored bit to applied reference data. Some CAMs contain a plurality of comparators (e.g., exclusive OR (XOR) gates) in addition to the core memory cells, each comparator being associated with a separate one of the memory cells in each row of the array. The comparators associated with the memory cells in each row have their outputs logically combined with each other, providing the CAM with the advantage of matching a match word to the word stored in each row of the array. In addition, some CAMs also offer a feature known as a "wild card" which allows masking of selected bits of the match word. Thus, CAMs are similar to conventional RAMs in that they contain a matrix array of memory cells which can be used to write/read data in random fashion; but they also provide the content-addressable matching features of CAMs.

In particular, a CAM is a memory array with ancillary circuitry to provide priority matching (with or without wild card capabilities) that can return the address of the first (lowest) addressed memory element that matches a given input (reference). In CAMs such as the Lucent Standard-Cell CAM in the Lucent Technologies™ Standard Cell Library (see *LV250C 2.5Volt: 0.25 µm CMOS Standard-Cell Library*, Lucent Technologies 1998), a CAM may provide, for example, 1024 entries, each of which has up to 72 bits. In general, a CAM is assumed to have E entries each of which has N bits plus an additional "valid bit". The entries are addressed with M address bits, with the addresses starting at 0 and running to a maximum of $2^M-1$ where, in matching, the numerically smaller (lower) addresses have higher priority. In addition to having priority matching, this core also allows for bit writing, wild card matching, and a valid bit associated with each entry. The valid bit is writable, and searches can be restricted to only valid entries, only invalid entries, or all entries. The valid bit may be used in this manner to avoid having to write or erase all of the cells, e.g. upon start-up, which might otherwise be required to ensure that random or meaningless data does not cause an erroneous search result.

In a CAM such as a Lucent Standard-Cell CAM, a match operation is used to realize the search function to find data. The match operation uses a Match Search input and generates a Match Address output and related Match Address output information such as a 3-state Match Address output, a Match output flag, and a Multiple Match output. In the match operation, the value of the Match Search input is compared to the data content of each entry in the CAM. If a match exists between the Match Search input and any of the memory content, the Match output flag will go high and the Match Address output will change to the lowest significant address location where a match occurred. If a match does not occur, the Match flag will go low. If more than one match exists, the Multiple Match flag will go low.

In a wild card operation, the user can ignore bits of the data in the match operation. For example, if the nth bit of the wildcard (WC) is high, the nth bit of the entries will not be compared to the corresponding bit of the match search input; the rest of the N-1 bits will be used for the comparison.

Memory tests of semiconductor memory devices such as RAM ICs (e.g., DRAMs and SRAMs) are typically performed by the manufacturer during production and fabrication to ensure correct functioning. Such devices are also sometimes tested by downstream manufacturers of computer systems embodying the RAMs, as well as by an end user during computer initialization, to determine if the circuits are operating as intended. The testing is typically performed by a memory controller or processor (or a designated processor in a multi-processor machine) which runs a testing program or algorithm.

RAMs are usually subjected to data march tests and data retention tests. In a march or marching test, a sequence of read and/or write operations is applied to each cell of the memory array or matrix, either in increasing or decreasing address order; i.e., patterns are marched across the memory array. A march test is analogous to a walking bit test, but done on a word basis, and is able to detect various types of faults. Various types of march tests detect different types of faults in varying amounts of time. In the March LR test, for example, the following types of faults may be detected: stuck open faults; stuck at faults; transition faults; coupling faults, including CFins (inversion coupling), CFids (Idempotent coupling), CFsts (state coupling), and CFdsts (coupled disturb); linked faults (linked faults appear as more than one fault that interact, therfore more than one type of fault can be linked); AF (address faults); TF (transition faults); address decoding faults, including no access faults, wrong access faults, multiple access faults, and address bit transition faults; column multiplexer stuck at faults; bit write faults; and I/O bus faults.

March tests are particularly popular for built-in self-test (BIST) techniques, because they can be efficiently implemented with a small amount of hardware, with predictable fault coverage, as noted above with respect to the March LR test. In general, therefore, the memory cell arrays of RAMs, such as SRAMs, are tested with memory array tests such as a march test.

In data retention tests, every cell of the memory is written and checked after a pre-specified interval to determine if leakage current has occurred that has affected the stored logic state.

Such memory array testing ensures that hidden defects will not be first discovered during operational use, thereby rendering end-products unreliable. March tests and other techniques are described in further detail in A. J. van de Goor, *Testing Semiconductor Memories: Theory and Practice* (New York: Wiley & Sons, 1996); and A. J. van de Goor, G. N. Gaydadjiev, V. N. Yarmolik & V. G. Mikitjuk, "March LR: A Test for Realistic Linked Faults," 14*th VLSI Test Symposium*, pp. 272–280; A. J. van de Goor, et al., "Effective March Algorithms for Testing Single-Order Addressed Memories," *Journal of Electronics Testing: Theory and Applications*,Vol.5, No.4, pp. 337–345, November 1994.

There is also a need to test CAMs. Often the CAM tests itself upon power-up, with a BIST. CAMs may also be tested externally. Providing a complex, very large scale IC (VLSIC) with BIST capability allows very high fault coverage to be obtained without the need for sophisticated external test equipment. Because of the different designs of various types of memories (RAMs, ROMs, FIFOs, etc.), separate BIST techniques are required for such different functional structures.

As noted above, CAMs are similar to conventional RAMs but also have matching and possible wild card features. The matching and wild card features of CAMs cause them to be more complex as compared to other types of memories such as RAM. For that reason, current BIST and other testing techniques used for RAMs are not always suitable for CAMs. There is, therefore, a need for CAM testing techniques (either used as a BIST or as an external test) which test the functionality of all of the features and functions of the CAMs, including matching and the wild card and valid bit functions described above.

SUMMARY

In the present invention, a method is provided for testing the functionality of a content-addressable memory (CAM) having a memory array for storing data, the memory array having E entries each having N data bits and a valid bit. First, the memory array is tested for read/write functionality. The functionality of a matching function, a priority encoding function, a match flag function, and a multiple match flag function of the CAM is tested. The functionality of an invalidate data function and a valid data restricted search function is also tested.

BRIEF DESCRIPTION OF THE DRAWINGS

FIG. 2 is a flow chart illustrating the CAM-testing method of the present invention;

FIGS. 3A–C are tables illustrating a CAM testing technique in accordance with an embodiment of the present invention.

DESCRIPTION OF THE PREFERRED EMBODIMENT

The present invention provides a test algorithm for testing the functionality of all of the features of CAMs which have random-access addressable data, content-addressable data with both matching and wild card capability, and a valid bit for each entry. Thus, in addition to the SRAM-type faults detected by a march test of the memory array, the present invention tests for match faults, wild card faults, and valid/invalid data faults, as well as address priority, and data retention faults. The test algorithm may be used for a BIST mechanism built into the CAM itself, or as part of an external test. In an embodiment, the test algorithm of the present invention is implemented as a BIST. In a BIST implementation, the present invention, in one embodiment, also tests the functionality of the BIST hardware.

Figure 1:
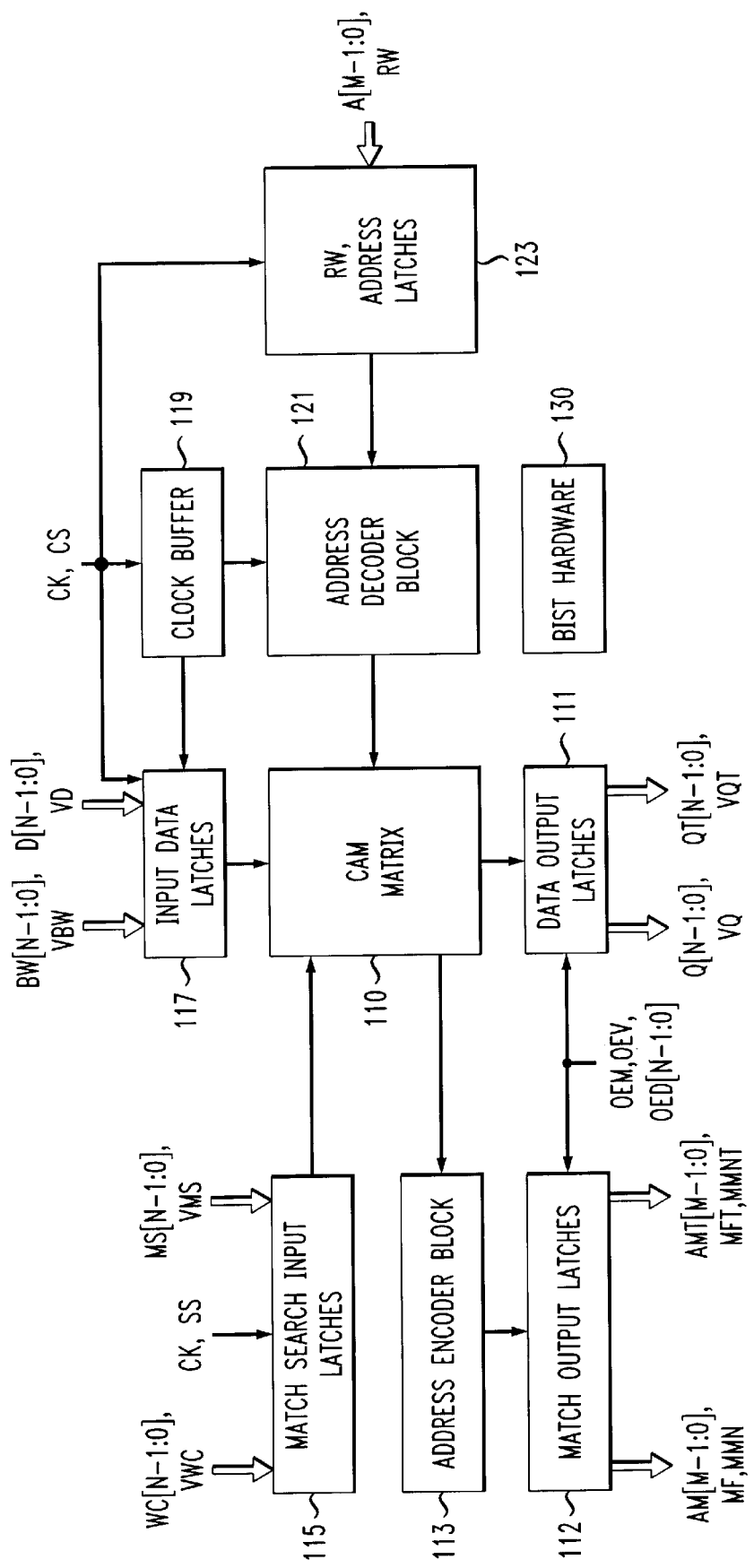
FIG. 1 is a block diagram of a CAM which is tested in accordance with the CAM-testing technique of the present invention.

Referring now to FIG. 1, there is shown a block diagram of a CAM system 100 which is tested in accordance with the CAM-testing technique of the present invention. CAM system 100 comprises CAM matrix 110, data output latches 111 match output latches 112, address encoder block 113, match search input latches 115, input data latches 117, clock buffer 119, address decoder block 121, and RW-address latches 123, intercoupled as shown. CAM system 100 also comprises BIST hardware or unit 130, which stores and implements the CAM-testing algorithm of the present invention. During normal operation of CAM system 100, the various input and output lines are coupled to external hardware of a larger telecommunications or computer system for the searching, storing, and retrieval of data stored in CAM matrix 110. The data on these signals may be multiplexed, via suitable multiplexers or switches, so that BIST unit 130 provides inputs to and monitors outputs from the other components of CAM system 100 during the test. As will be appreciated, in an alternative embodiment, BIST unit 130 is not present and the test algorithm of the present invention is performed by external testing equipment which is coupled to the input and output signals of CAM system 100.

The components of CAM system 100 other than BIST hardware 130 are, in one embodiment, similar to those of a Lucent Standard-Cell CAM in the Lucent Technologies™ Standard Cell Library (see *LV250C 2.5 Volt: 0.25 μm CMOS Standard-Cell Library*, Lucent Technologies 1998). As will be appreciated, in an embodiment, CAM is a parameterizable content addressable memory function. Layout of CAM system 100 is implemented as a custom, pitch-matched array of cells designed to be area efficient. CAM system 100 has the following features: positive edge-triggered input latches; requires a single clock for proper synchronous operation; priority encoded match address output; match flag and multiple match flag outputs; 3-statable outputs with asynchronous output enable; per bit write control; powerdown ability; wild card match bits; one valid bit per entry; search across valid data, invalid data, or both; and invalidate entries on match function. CAM system 100 can be customized by its number of entries, E, and number of bits per entry, N. The valid range for these parameters, in one embodiment, is specified in the following table:

TABLE 1

| Parameter | Description | Increment | Limit Minimum | Limit Maximum |
|---|---|---|---|---|
| E | Entries | 1 | 2 | 1024 |
| N | Bits/Entry | 1 | 1 | 72 |
| M | Address bits | 1 | 1 | 10 |

It should be noted that the parameter N does not include the Valid bit, and M denotes the number of address bits, where M=ceiling(log(E)/log(2)). Ceiling(x) is defined as the smallest integer greater than or equal to x.

The terminals of the various components of CAM system 100 correspond to the following input/output signals:

Inputs: A[M-1:0], D[N-1:0], BW[N-1:0], RW, CS, CK, OED[N-1:0], OEM, MS[N-1:0], WD[N-1:0], SS, VD, OEV, VBW, VMS, VWC, IV, FC;

Outputs: Q[N-1:0], QT[N-1:0], AM[M-1:0], AMT[M-1:0], MF, MFT, MMN, MMNT, VQ, VQT:

More particularly, the inputs and outputs include:

| | |
|---|---|
| A[M-1:0] | Address Inputs. |
| D[N-1:0] | Data Inputs. |
| BW[N-1:0] | Bit Write Enable (Active-High). |
| RW | Read/Write (Active-High for Read). |
| CS | Chip Select (Active-High). |
| CK | clock (Active-High). |
| OED[N-1:0] | data Output Enable (Active-High) |
| OEM | Address, Match Flag, and Multiple Match Flag Output Enable (Active-High). |
| MS[N-1:0] | Match Search Inputs. |
| WC[N-1:0] | Wild Card Inputs (Active-High). |
| SS | Search Select (Active-High). |
| VD | Valid Bit Input (Active-High for Valid). |
| OEV | Valid Bit Output Enable (Active-High). |
| VBW | Valid Bit Write Enable (Active-High). |
| VMS | Valid bit Match Search Input (Active-High for Valid Data). |
| VWC | Wild Card Valid Bit Input (Active-High). |
| IV | Invalidate (Active-High). |
| FC | Function Control (dc input to be connected to VSS or VDD). |
| Q[N-1:0] | Data Outputs. |
| QT[N-1:0] | 3-Stable Data Outputs. |
| AM[M-1:0] | Match Address Outputs. |
| AMT[M-1:0] | 3-Stable Match Address Outputs. |
| MF | Match Flag (Active-High). |
| MFT | 3-Statable Match Flag (Active-High). |
| MMN | Multiple Match Flag (Active-Low). |
| MMNT | 3-Stable Multiple Match Flag (Active-Low). |
| VQ | Valid Bit Output (Valid-Active-High). |
| VQT | 3-Statable Valid Bit Output (Valid-Active-High). |

A CAM system such as CAM system 100 may be tested using the method of the present invention. The test algorithm of the present inventions consists of several individual tests that verify the performance of the different functions provided by CAM system 100. Referring now to FIG. 2, there is shown a flow chart 200 illustrating the CAM-testing method of the present invention. The memory array (CAM matrix 110) is first tested by a traditional march test to check its correct function (step 200). A combined test is then performed to test the matching operation, priority encoding operation, and match flag and multiple match flag operation (step 203). Next, the wild card matching function is tested (step 204). Alternatively, steps 203 and 204 may be combined in the same test.

A series of tests are then performed to check the function of the valid bits, namely the invalidate data command and restricted searches, and associated circuitry (step 205). These tests may be performed in accordance with a variety of embodiments, as described below. For example, a walking 1 may be used as input to the data register or a walking 1 on the bit write enable register to provide a series of input patterns. In a BIST implementation, the functionality of the BIST hardware is also optionally tested via a cone test (step 206). This test ensures that the comparator function of the BIST hardware 130 is operating properly. After all of the foregoing tests, a data retention test is performed (step 207). This test typically takes a longer time than the other tests and thus is done last, only after all the other tests are performed successfully.

In one embodiment, CAM system 100 has design specifications similar to those of the Lucent Standard-Cell CAM as noted above. Thus, CAM system 100 is assumed to have E entries, each of which has N bits plus an additional "valid bit". As explained previously, in matching, the numerically smaller (lower) addresses have higher priority. In addition to having priority matching, this core also allows for bit writing, wild card matching, and a valid bit associated with each entry. The valid bit is writable, and searches can be restricted to only valid entries, only invalid entries, or all entries. A match operation is used to realize the search function to find data. The match operation uses a Match Search input and generates a Match Address output and related Match Address output information such as a 3-state Match Address output, a Match output flag, and a Multiple Match output, as described above.

Memory Cell Test

Because of the SRAM-like structure of the basic CAM cell in some implementations, a traditional memory test can be applied to test the CAM to test the memory array itself (i.e., CAM matrix 110) (step 200). Thus, in the present invention, a variant of the March LR Algorithm is used to test CAM matrix 110. For this test, valid bits are treated the same as data bits, so that each entry has N+1 total bits to be tested. In one embodiment of the present invention, a variation of the March LR algorithm is utilized in which the opposite data patterns are written. This is done in order to leave the memory in the valid state after the test; in this test, the valid bit is treated the same as the data bits, and the value "1" is the active state for the valid bit. On entry, the memory has all unknown values, and at exit all bits should be set to the value "1". The test performs a total of 14 word wide Reads and Writes, in a series of six march elements, as illustrated in the pseudocode below:

```
// March LR
// Memory values: UNKNOWN
March 0: ⇓(W 1);
March 1: ⇓(R 1); (W 0);
March 2: ⇑(R 0); (W 1); (R 1); (W 0);
March 3: ⇑(R 0); (W 1);
March 4: ⇑(R 1); (W 0); (R 0); (W 1);
March 5: ⇑(R 1);
// Memory values: All bits (data and valid) "1"
```

Address Priority/Match Test and Wild Card Test (Column Version)

After performing the memory cell test noted above, an address priority/match test is performed (step 203). This is a unified test that tests, in a single testing procedure, the matching operation, priority encoding operation, and match flag and multiple match flag operation. The matching operation is tested to ensure that a match is indicated only when the search pattern matches the entries found to be matched. The priority encoding operation is tested to ensure that, in the case of multiple matches, the correct priority is used, i.e. the address of the first (lowest) addressed memory element that matches a given input (reference) is returned. The match flag and multiple match flag operations are tested to ensure that these flags properly indicate no match, a single match/any match, or multiple matches.

The wild card matching function is also tested (step 204). As described above, the wild card matching function allows given bit entries to be ignored when a match comparison is made. The wild card capability should be thoroughly tested to assure correct functional system operation. The wild card function may be tested separately, after the combined address priority/match test of step 203, or it may be combined in the same unified test that tests the matching operation, priority encoding operation, and match flag and multiple match flag operation. The following description of the address priority/match test assumes that the wild card operation is also tested as part of the address priority/match test.

In one embodiment, the tests of steps 203, 204 are done on a column basis. The address priority function provides the address of the lowest memory element that matches a given input probe entry. Additional capability is given by allowing given bit entries to be ignored when this comparison is made (so called "wild card" probes). These capabilities should be thoroughly tested to assure correct functional system operation.

On entry, the memory is assumed to be valid with all data bits 1. This condition is obtained by the operations performed in step 201. According to the present invention, each bit in the CAM array is tested for matching, address priority, and wild card operation. These tests are conducted using both data background patterns. This test proceeds as follows:

start with all entries written to the same value;
proceed column-by-column from the smaller (higher priority) address to the larger (lower priority) address;
change an individual bit in the current entry to the complementary value; and attempt a matching operation to search for an entry consisting of the original entry value, since the current entry has been modified, the match result should indicate the next entry of lower priority (i.e. the address one larger) except in the case of the lowest priority entry where a non-match result should be indicated;

another match operation is performed, but now with the wildcard bit corresponding to the current column activated; and the current entry should be indicated by the matching circuitry;

after this step, the entire entry should be written with the complementary value to ensure that further match operations will not erroneously indicate a higher priority entry. This full entry write also initializes the entry for further testing.

This procedure tests not only the match functionality, but also the address priority circuitry and wildcard operation in a single march element. If we were to proceed from the lowest priority address to the highest priority address, this combined testing would not be possible since any of the wildcard tests would indicate the same (highest priority) entry.

After the entire column has been tested as above, the memory array should consist of entries complementary to their original contents (i.e. 0). The test proceeds on the same column, mutatis mutandis, with the complementary values used. After this step, this phase of testing for the current column is completed and the entries in the array should be restored to have their original contents (i.e. all 1s). The test continues by performing these tests on the other N−1 columns until, at the end, the entire array has been tested and left in an all 1s state.

Thus, the address priority/match test of the present invention allows for efficiently combining the testing of the matching operation, priority encoding operation, and match flag and multiple match flag operation, as well as wild card testing.

An example for a four entry two bit (4×2) CAM matrix 110 follows. The following represents testing a single column in a "march like" method. Each of the tables represents a test for a single bit and consists of four sub-steps: a bit write, a match without wild cards, a match with wild cards, and a word write. The left two columns represents the CAM's memory array (matrix 110), and the right column (labeled "V") represents the valid bit, where the higher priority entry addresses (lower address) are at the bottom. Addr. is the address to be written; Op. is the operation to be applied (where Wb0 is a bit write of 0, M is a match, and WW0 is a word write of 0); WC denotes if the wild card flag for this bit should be set; Mat is the matching address; and Res. is the result of the match (Match, Multiple Match, or No Match). All of the operations are performed for testing the low bits of the entries in decreasing priority, and all of the matches are for an entry of all "1"s. The memory cells show the values after the operation has been performed:

| V | Addr. | Op. | WC | Mat. | Res. | V | Addr. | Op. | WC | Mat. | Res. |
|---|---|---|---|---|---|---|---|---|---|---|---|
| 1 | 1 | 1 | | | | 1 | 1 | 1 | | | |
| 1 | 1 | 1 | | | | 1 | 1 | 1 | | | |
| 1 | 1 | 1 | | | | 1 | 1 | 1 | | | 01 | MM |
| 1 | 1 | 0 | 00 | Wb0 | | 1 | 1 | 0 | | M | N |

-continued

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 1 |   |   |   |   | 1 | 1 | 1 |   |   |   |   |
| 1 | 1 | 1 |   |   |   |   | 1 | 1 | 1 |   |   |   |   |
| 1 | 1 | 1 |   |   |   |   | 1 | 1 | 1 |   |   |   |   |
| 1 | 1 | 0 |   | M | Y | 00 | MM | 0 | 0 | 0 | 00 | WW0 |   |

The testing algorithm of the present invention then proceeds to perform operations for testing the low order bit of the second lowest address, as illustrated as follows:

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 1 |   |   |   |   | 1 | 1 | 1 |   |   |   |   |
| 1 | 1 | 1 |   |   |   |   | 1 | 1 | 1 |   |   |   | 10 | MM |
| 1 | 1 | o | 01 | Wb0 |   |   | 1 | 1 | 0 |   | M | N |   |
| 0 | 0 | 0 |   |   |   |   | 0 | 0 | 0 |   |   |   |   |

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 1 |   |   |   |   | 1 | 1 | 1 |   |   |   |   |
| 1 | 1 | 1 |   |   |   |   | 1 | 1 | 1 |   |   |   |   |
| 1 | 1 | 0 |   | M | Y | 01 | MM | 0 | 0 | 0 | 01 | WW0 |   |
| 0 | 0 | 0 |   |   |   |   | 0 | 0 | 0 |   |   |   |   |

Except for the address of the matches, the results are very similar to the first step described above. Continuing with the low order bit of the third entry:

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 1 |   |   |   |   | 1 | 1 | 1 |   |   |   | 11 | M |
| 1 | 1 | 0 | 10 | Wb0 |   |   | 1 | 1 | 0 |   | M | N |   |
| 0 | 0 | 0 |   |   |   |   | 0 | 0 | 0 |   |   |   |   |
| 0 | 0 | 0 |   |   |   |   | 0 | 0 | 0 |   |   |   |   |

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 1 |   |   |   |   | 1 | 1 | 1 |   |   |   |   |
| 1 | 1 | 0 |   | M | Y | 10 | MM | 0 | 0 | 0 | 10 | WW0 |   |
| 0 | 0 | 0 |   |   |   |   | 0 | 0 | 0 |   |   |   |   |
| 0 | 0 | 0 |   |   |   |   | 0 | 0 | 0 |   |   |   |   |

In this case, the major change is that in the match without wild card, there is a simple match (and not a multiple match) on the lowest priority entry. One more iteration completes the first phase:

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 0 | 11 | Wb0 |   |   | 1 | 1 | 0 |   | M | N | 11 | NM |
| 0 | 0 | 0 |   |   |   |   | 0 | 0 | 0 |   |   |   |   |
| 0 | 0 | 0 |   |   |   |   | 0 | 0 | 0 |   |   |   |   |
| 0 | 0 | 0 |   |   |   |   | 0 | 0 | 0 |   |   |   |   |

|   | V | Addr. | Op. | WC | Mat. | Res. |   | V | Addr. | Op. | WC | Mat. | Res. |
|---|---|---|---|---|---|---|---|---|---|---|---|---|---|
| 1 | 1 | 0 |   | M | Y | 11 | M | 0 | 0 | 0 | 11 | WW0 |   |
| 0 | 0 | 0 |   |   |   |   | 0 | 0 | 0 |   |   |   |   |
| 0 | 0 | 0 |   |   |   |   | 0 | 0 | 0 |   |   |   |   |
| 0 | 0 | 0 |   |   |   |   | 0 | 0 | 0 |   |   |   |   |

In this case, the match without wild card did not match, and the match with wild card turned up a simple match as would be indicated by the match flags.

At this point the memory is completely "0". The algorithm proceeds by performing similar operations on the first column, only with the roles of "1" and "0" reversed. Then, these two operations are performed on the other N−1 columns to complete the address priority and wild card test. At the end of the address priority and wild card test, the entries are all "1"s and are valid. As will be appreciated, the above may be generalized for a matrix with E entries of N bits each. Thus, the CAM-testing of the present invention tests the matching function at the same time as priority encoding is tested, thus yielding faster and more thorough testing.

It should be noted that in this test, a match of all "1"s is never performed when the entries consist of all "1"s (and similarly for "0"s). This may be addressed, in an embodiment, by adding a pair of tests at the top and bottom of the above test to check for these values ("1" at the top and "0" at the bottom). As described in further detail below, an alternative algorithm may be employed which addresses this problem with a testing method that has consistent addressing, but with a slight increase in the number of operations performed.

Address Priority/Match Test and Wild Card Test (Row/Word Version)

In an alternative embodiment, an address priority/match test is performed on a row basis instead of on a column basis as described in the preceding section (step 203). In this alternative embodiment, the address priority/match test proceeds by rows instead of by columns. Since this row-based test is functional, it does not matter in which order the individual matching operations are performed, as long as the test is complete. Operating row by row may be advantageous in a BIST implementation because the address operated on is held constant while a bit march is applied horizontally over the entries, i.e. a 1 is walked across the words. The handling of the special cases of the first, penultimate, and last entry may also be simplified, since the matching address remains constant for each entry. The row-based wild card test in the row version embodiment of the test may not be as thorough as the column-based version described above, because not every bit in the CAM matrix 110 is tested, but it can produce suitable results and can be performed more efficiently.

Figure 3B:
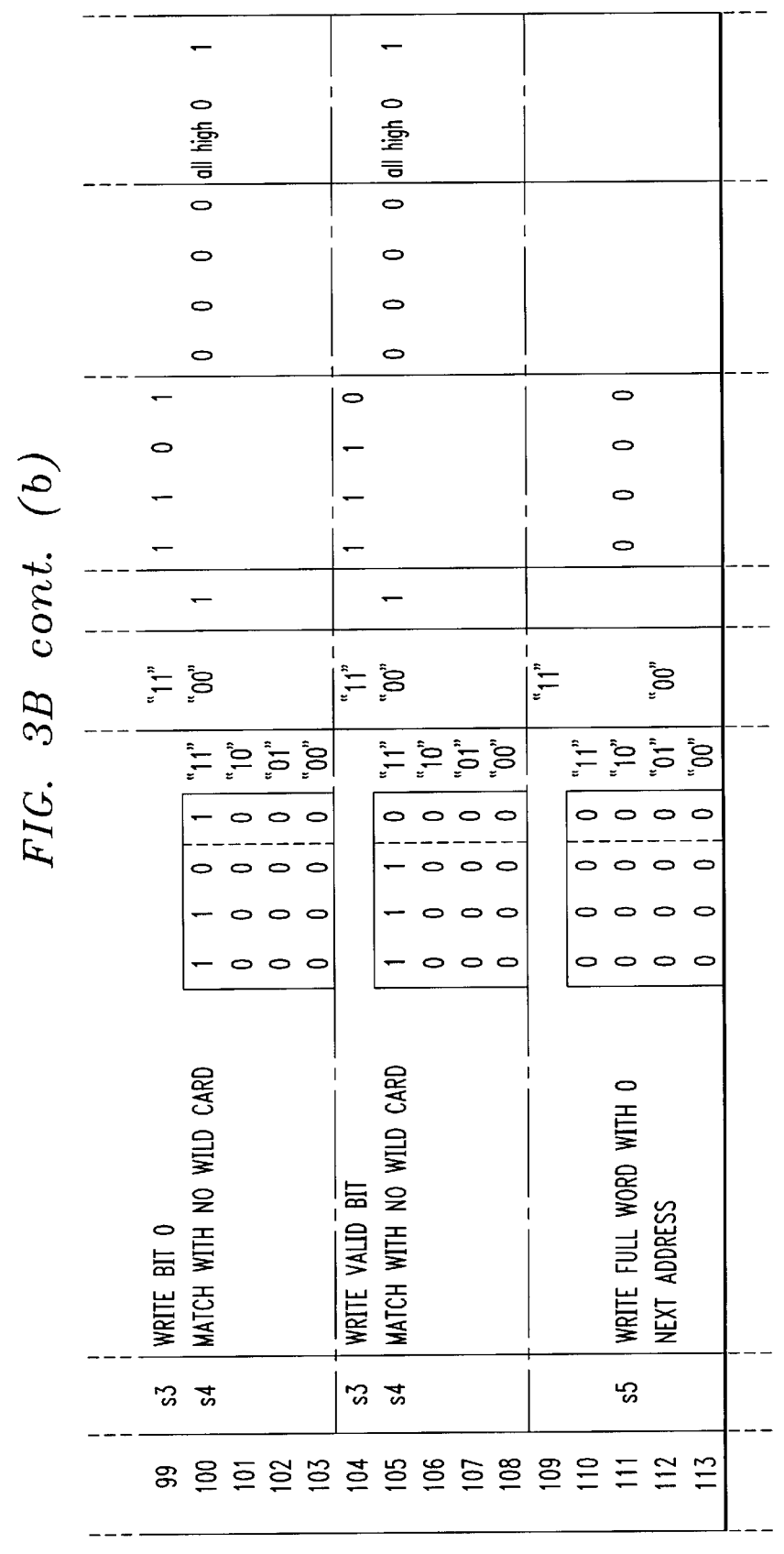
Figure 4:
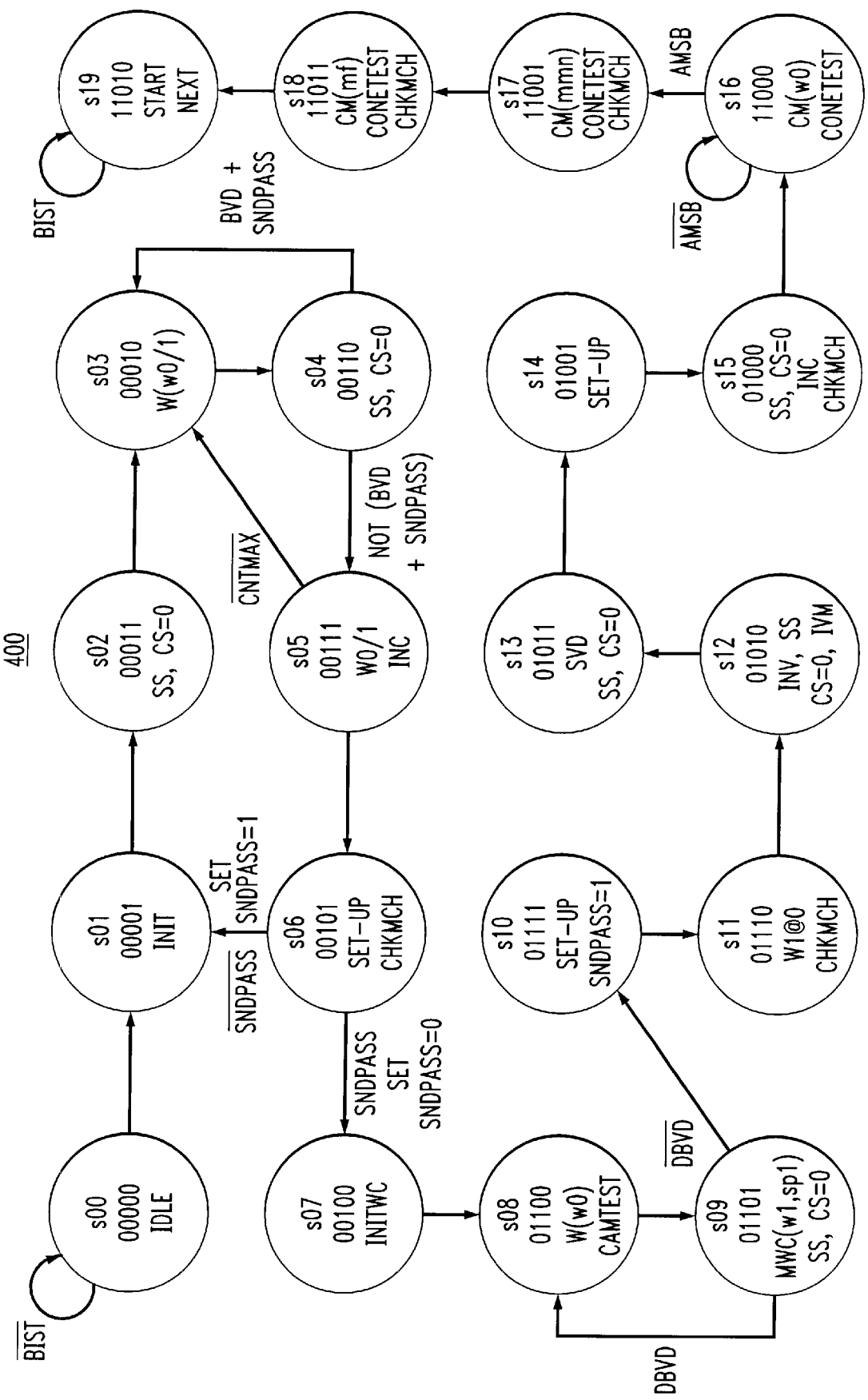
FIG. 4 is a state diagram of the CAM testing technique of FIGS. 3A–C.

An example of a row by row implementation for a 4×3 bit CAM follows. Referring now to FIGS. 3A–C, there are shown tables illustrating the row-based CAM testing technique of the present invention. FIG. 4 is a state diagram 400 of the CAM testing technique of FIGS. 3A–C. FIGS. 3A–C describe the operation of the CAM testing of the present invention with reference to states s0 through s11. States s0 through s11 are also shown in graphical form in state diagram 400, and correspond to the testing of steps 203, 204, 205, and 206 of flowchart 200 of FIG. 2. As noted above, the CAM-testing of the present invention tests the matching function at the same time as priority encoding is tested, thus yielding faster and more thorough testing, by proceeding from higher to lower priority addresses, as described above. This corresponds to states s0 to s6 of the 4×3 bit example. A separate test for wildcard matching is illustrated in states s7 to s9. It should be noted that, in this embodiment, only a single word is checked for wild card operation; this presents a tradeoff between test efficiency and cost. States s10 through s15 illustrate the testing steps involved in checking for correct operation of invalidate command, valid data searching, invalid data searching, and all data searching.

States s16 to s18 correspond to the cone test performed to test the proper operation of BIST hardware 130, in BIST implementations. In state s19, the next BIST is started. These states are described in further detail in the following section.

State Table and Diagram

Figure 3B:
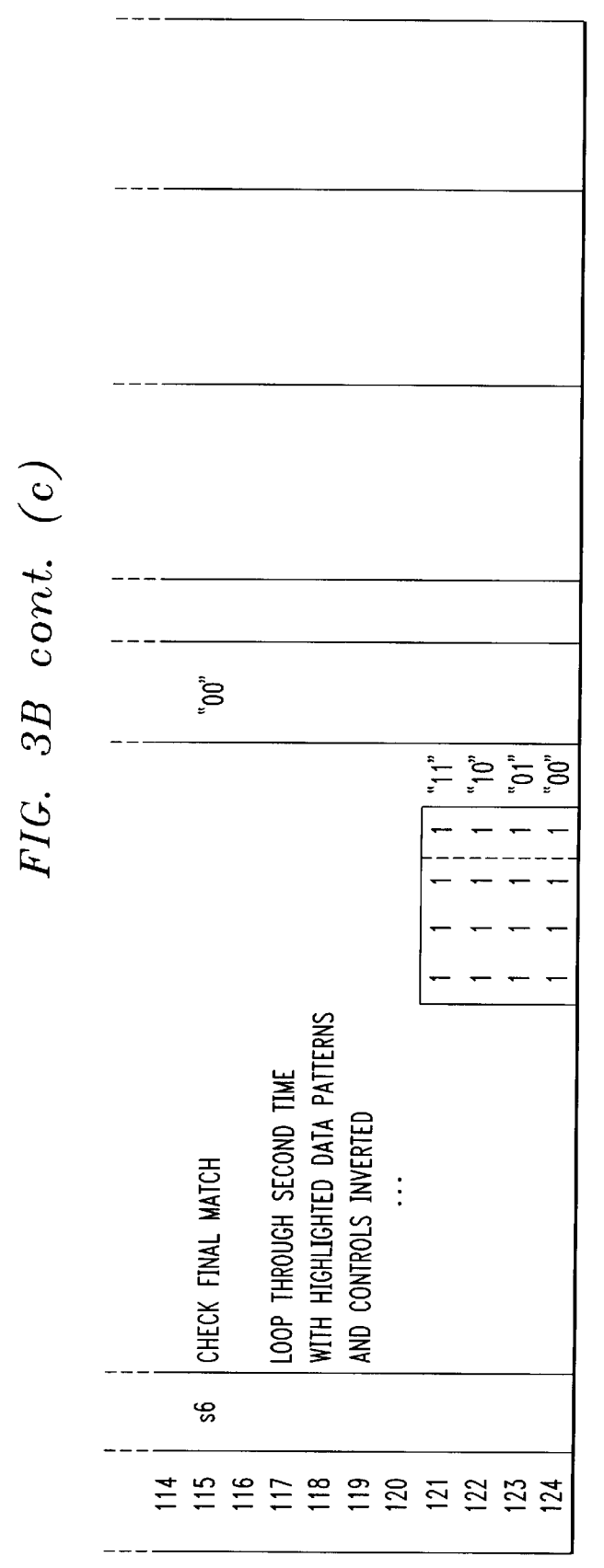

As explained above, FIG. 3 represents an embodiment of the row-based CAM testing technique of the present invention. In FIG. 3, column titles represent the following:

Line number;

State: the state of the finite state machine when this step is performed;

Operation: the current test step being applied to the CAM;

CAM memory: the current status of the cam memory array where the first three columns represent the data values, the next column is the valid bit, and the last column is a label indicating the address of the word represented in this row (in binary);

Address pointer: the address of the current word being operated on and tested, which value should be presented to the RW address latches 123;

VMS Bit: the valid match bit indicating the only valid data is to be tested;

Data Write Pattern: the pattern to be written to the CAM, and which should be presented to input data latches 117 as inputs;

D and VD: data bits (3) and the valid data bit; and

Wild Card Pattern: indicates which bit should be ignored during search functions or operations, and which should be presented to input search input latches 115 as the WC and VWC inputs.

As shown in tabular form in FIG. 3, the following steps are performed in an embodiment:

S0 is an initialization step, where the Bit Write Pattern indicates which bits in the current word are allowed to be written to; this pattern should be presented to the input data latches 117 as inputs BW and VBW, and initializes the value of match search input latches 115 MS and VMS;

S1 initializes the RW address latches 123;

S2 performs a search without wildcards for a pattern consisting of all 1s;

S3 writes the a single bit in the current entry to the value 0, leaving the other bits at 1;

S4 performs a search without wildcard for the pattern consisting of all 1s;

S5 performs a full word write at the current location of all 0s;

S6 indicates that the previous steps should be performed, but with the indicated data values complemented;

S7 initializes for wildcard testing;

S8 writes a single bit in the current entry to the value 0;

S9 performs a match operation with a single wildcard bit set;

S10 initializes for invalidate/valid data searching;

S11 rewrites the first entry with all 1s;

S12 invalidates all of the entries;

S13 performs a search restricted to only valid data;

S14 is another initialization step;

S15 performs a search on all data;

S16–S18 performs a test of the BIST output comparators; and

S19 is a concluding step.

Referring once more to FIG. 4, there is shown a graphical representation of the states illustrated in tabular form in FIGS. 3A–C. In state diagram 400 of FIG. 4, each circle represents a state in the finite state machine controlling the BIST. The top line in each circle is the state name, and the next line is a suitable state assignment for implementing this circuit. The additional information indicates the settings of the various signals and additional descriptions. The arcs represent the state transitions where the backward (higher state number to lower state number) arcs represent iteration of a cycle of states.

Invalidate/Validate Data Test

The ability to mark each individual entry as either valid or invalid (that is, whether each entry should participate in the matching operation), i.e. the invalidate data command, is a function that must also be thoroughly verified. Thus, a third series of tests are performed to check the function the invalidate data command and restricted searching (step 205). This test, therefore, tests to ensure that the invalidate data command works to actually set all the valid data bits to 0; and tests that restricted searching (i.e. restricting a search to only valid entries, to only invalid entries, or to all entries) operates properly. In one embodiment, a type of march algorithm is employed for this purpose, which contains three major steps: (1) The match and invalidate command is tested to invalidate the data. (2) The data is revalidated with a march through memory from highest address to lowest address. (Note: there is no revalidate data command in CAM system 100.) (3) The data is invalidated again using a march from the lowest address to the highest address. Various checks are made during these tests to verify correct operation. These steps may be described in further detail as follows:

Step 1. (Check the Invalidate Data command)

| Operation | Expected Result |
|---|---|
| // Check for valid operations on valid data | |
| // This first check should be redundant | |
| Match(1) Valid Only | Low address & Multi-Match |
| // This is first real check | |
| Match(1) Invalid Only | High address & No Match |
| // Invalidate the data (many variations possible) | |
| Match(1) Valid only $\overline{CS}$ Invalidate | All data invalidated (LA & MM) |
| // Check for valid operations on invalid data, both checks matter | |
| Match(1) Valid Only | High address & No |
| Match(1) Invalid Only | Low address & Multi-Match |

Step 2. (Revalidate the data by writing the valid bits to 1 from HA to LA)

```
↓ M-1 ⎫
       ⎬
  0    ⎭
```
// Let i denote the current address, HA the max address & LA the min address
// Revalidate by writing valid bit to 1
    W0 (VD VBW)    Current entry revalidated
// Check the result
// Search Valid only
    Match(1) Valid Only    i & multi-Match unless i = HA then i & match
// Search Invalid only
    Match(1) Invalid Only    LA & Multi-Match unless i == LA+1 then LA+1 & Match unless i == LA then MA & No Match
}

Step 3. (Invalidate the data by writing the valid bits to 0 from LA to HA)

```
↑ M-1 ⎫
       ⎬
  0    ⎭
```
// Let i denote the current address, HA the max address & LA the min address
// Invalidate by writing valid bit to 0
    W1 (VD == 0 VBW)    Current entry invalidated
// Check the result
// Search Valid only
    Match(1) Valid Only    i + 1 & Multi-Match unless i == HA-1 then i+1 Match unless i == HA then HA & No Match
// Search Invalid Only    LA & Multi-Match unless i == LA then LA & Match
}

BIST Functionality Test

In a BIST implementation, the comparator functional of the BIST hardware is also tested via a cone test (step 206; states s16 to s18 of FIGS. 3, 4). This test ensures that the comparator function of the BIST hardware 130 is operating properly. This test is done because BIST hardware 130 contains a comparator which compares data provided on data and match output latches 112, 113 with expected data. Thus, to ensure proper testing results of the foregoing tests, the comparator function of BIST hardware 130 is also tested. This cone test is performed for both a column-by-column and a row-by-row embodiment, to test the BIST comparators.

Data Retention Test

After all of the foregoing tests, a data retention test is performed (step 207). This test typically takes a longer time than the other tests and thus is done last, only after all the other tests are performed successfully. The data retention test is preferably done by waiting for a specified time interval (e.g., 100 ms) after the end of the other tests when a given pattern of data (e.g., mostly all 1's) is stored in the cells of CAM matrix 110 (including the valid bits as in the march test of step 200). The data is then read from CAM matrix 110 and compared to the expected data. Next, the complement of this data pattern is written into CAM matrix 110 and the test waits for another time interval to elapse before once more reading the complementary data pattern and comparing it to the expected pattern.

Complete CAM Test

As will be appreciated, the above described tests are combined in the CAM-testing method of the present invention, in an embodiment, to provide a complete operational test for CAM system 100.

Considerations and Modifications for Built In Self Test

The above-described CAM test may be modified to achieve low overhead (area), fast test execution (time), or low power requirements. Such modifications may make the CAM-testing more suitable for some BIST implementations, for example.

The present invention can also be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted as a propagated computer data or other signal over some transmission or propagation medium, such as over electrical wiring or cabling, through fiber optics, or via electromagnetic radiation, or otherwise embodied in a carrier wave, wherein, when the computer program code is loaded into and executed by a computer, the computer becomes an apparatus for practicing the invention. When implemented on a future general-purpose system-on-chip or microprocessor sufficient to carry out the present invention, the computer program code segments configure the system to create specific logic circuits to carry out the desired process.

In an embodiment, CAM system 100 is implemented as part of an IC.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A method for testing the functionality of a content-addressable memory (CAM) having a memory array for storing data, wherein the memory array has E entries each having N data bits and a valid bit, the method comprising the steps of:

(a) testing the memory array using a read/write operation;

(b) testing the memory array using a matching operation, a priority encoding operation, a match flag operation, and a multiple match flag operation of the CAM; and (c) testing the memory array using an invalidate data operation and a valid data restricted search operation.

2. The method of claim 1, wherein step (a) comprises the step of performing a march test of the memory array in which each valid bit for an entry is treated as a data bit so that each entry is treated as having N+1 bits, wherein the march test utilizes a data pattern such that the valid bits of the memory array are left in a valid state at the end of the march test.

3. The method of claim 1, wherein step (b) further comprises the step of testing the memory array using a wild card matching operation.

4. The method of claim 3, wherein the testing of step (b) is performed in a unified test.

5. The method of claim 3, wherein:

the functionality of the matching operation is tested to determine whether a match is indicated when and only when a search pattern actually matches at least one entry in the memory array;

the functionality of the priority encoding operation is tested to determine whether, in the case of multiple matches, the address of the lowest addressed memory element that matches the search pattern is returned;

the functionality of the match flag operation is tested to determine whether a match flag of the CAM indicates a match only when there is at least one match;

the functionality of the multiple match flag operation is tested to determine whether a multiple match flag of the CAM indicates a multiple match only when there are multiple matches; and the functionality of the wild card matching operation is tested to determine whether the wild card matching operation properly masks selected bits of the search pattern.

6. The method of claim 3, wherein the testing of step (b) is performed on a CAM column basis which proceeds column-by-column in the CAM from higher priority addresses to lower priority addresses.

7. The method of claim 3, wherein the testing of step (b) is performed on a CAM row basis which proceeds row-by-row in the CAM from higher priority addresses to lower priority addresses, wherein the wild card matching operation is tested only on a a single word.

8. The method of claim 1, wherein the memory array is tested using the invalidate data operation to determine whether the invalidate data operation actually invalidates all data bits in the CAM; and the memory array is tested using the valid data restricted search operation to determine whether searches restricted to entries in which the valid data bit is set, to entries in which the valid data bit is not set, or to all entries are properly restricted.

9. The method of claim 8, wherein step (c) comprises the following steps: testing the memory array using a match and invalidate command to invalidate the data; revalidating the data with a march sequence from the highest address to the lowest address by doing a bit write of 1 to each of the valid bits sequentially; and invalidating the data again using a march sequence from the lowest address to the highest address by doing a bit write of 0 to each of the valid bits sequentially.

10. The method of claim 1, comprising the further step of (d) performing a data retention test of the memory array only if the testing of steps (a)–(c) are completed successfully.

11. The method of claim 1, wherein the testing of steps (a)–(c) is performed by a built-in self-test (BIST) hardware component of the CAM.

12. The method of claim 11, comprising the further step of (d) performing a cone test to test the functionality of a comparator of the BIST hardware, wherein the comparator is for comparing data output by the CAM during the tests of steps (a)–(c) with expected data.

13. An integrated circuit having a CAM system, the CAM system comprising:

(a) a memory array for storing data, wherein the memory array has E entries each having N data bits and a valid bit; and (b) a built-in self-test (BIST) hardware component that:
       (1) tests the memory array using a read/write operation;
       (2) tests the memory array using a matching operation, a priority encoding operation, a match flag operation, and a multiple match flag operation of the CAM; and
       (3) tests the memory array using an invalidate data operation and a valid data restricted search operation.

* * * * *